(12) United States Patent
Lu et al.

(10) Patent No.: US 8,987,080 B2
(45) Date of Patent: Mar. 24, 2015

(54) METHODS FOR MANUFACTURING METAL GATES

(71) Applicant: Applied Materials, Inc., Santa Clara, CA (US)

(72) Inventors: Xinliang Lu, Fremont, CA (US); Seshadri Ganguli, Sunnyvale, CA (US); Atif Noori, Saratoga, CA (US); Maitreyee Mahajani, Saratoga, CA (US); Shih Chung Chen, Cupertino, CA (US); Yu Lei, Foster City, CA (US); Xinyu Fu, Fremont, CA (US); Wei Tang, Santa Clara, CA (US); Srinivas Gandikota, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/865,285

(22) Filed: Apr. 18, 2013

(65) Prior Publication Data
US 2013/0295759 A1 Nov. 7, 2013

Related U.S. Application Data

(60) Provisional application No. 61/638,748, filed on Apr. 26, 2012.

(51) Int. Cl.
*H01L 21/336* (2006.01)
*H01L 21/8234* (2006.01)
(Continued)

(52) U.S. Cl.
CPC .. *H01L 29/66477* (2013.01); *H01L 21/823821* (2013.01); *H01L 21/28088* (2013.01); *H01L 21/3221* (2013.01); *H01L 29/4966* (2013.01); *H01L 29/78* (2013.01)
USPC ............ 438/199; 257/E21.177; 257/E21.632; 257/E21.637; 257/E21.639; 438/151; 438/154; 438/197; 438/216; 438/240; 438/275; 438/283; 438/289; 438/290; 438/587; 438/591

(58) Field of Classification Search
USPC ................... 257/E21.177, E21.632, E21.637, 257/E21.639; 438/151, 154, 197, 199, 216, 438/240, 275, 283, 289, 290, 587, 591
See application file for complete search history.

(56) References Cited

U.S. PATENT DOCUMENTS

| 6,890,807 B2 | 5/2005 | Chau et al. |
| 6,972,225 B2 | 12/2005 | Doczy et al. |

(Continued)

FOREIGN PATENT DOCUMENTS

| KR | 10-2005-0009526 | 1/2005 |

OTHER PUBLICATIONS

PCT International Search Report and Written Opinion in PCT/US2013/037321, mailed Jul. 26, 2013, 11 pgs.

(Continued)

*Primary Examiner* — Asok K Sarkar
(74) *Attorney, Agent, or Firm* — Servilla Whitney LLC

(57) ABSTRACT

Provided are methods for making metal gates suitable for FinFET structures. The methods described herein generally involve forming a high-k dielectric material on a semiconductor substrate; depositing a high-k dielectric cap layer over the high-k dielectric material; depositing a PMOS work function layer having a positive work function value; depositing an NMOS work function layer; depositing an NMOS work function cap layer over the NMOS work function layer; removing at least a portion of the PMOS work function layer or at least a portion of the NMOS work function layer; and depositing a fill layer. Depositing a high-k dielectric cap layer, depositing a PMOS work function layer or depositing a NMOS work function cap layer may comprise atomic layer deposition of TiN, TiSiN, or TiAlN. Either PMOS or NMOS may be deposited first.

20 Claims, 2 Drawing Sheets

(51) Int. Cl.
*H01L 29/66* (2006.01)
*H01L 21/8238* (2006.01)
*H01L 21/28* (2006.01)
*H01L 21/322* (2006.01)
*H01L 29/49* (2006.01)
*H01L 29/78* (2006.01)

(56) References Cited

U.S. PATENT DOCUMENTS

| | | | |
|---|---|---|---|
| 7,250,645 B1 | 7/2007 | Wang et al. | |
| 2007/0063296 A1* | 3/2007 | Choi et al. | 257/412 |
| 2007/0141797 A1* | 6/2007 | Li | 438/301 |
| 2008/0191286 A1 | 8/2008 | Chang et al. | |
| 2009/0108352 A1* | 4/2009 | Majumdar et al. | 257/347 |
| 2009/0148986 A1 | 6/2009 | Cheng et al. | |
| 2010/0127336 A1* | 5/2010 | Chambers et al. | 257/369 |

OTHER PUBLICATIONS

PCT International Preliminary Report on Patentability in PCT/US2013/037321, mailed Nov. 6, 2014, 7 pages.

* cited by examiner

METHODS FOR MANUFACTURING METAL GATES

CROSS-REFERENCE TO RELATED APPLICATIONS

This applications claims priority under 35 U.S.C. §119(e) to U.S. Provisional Application No. 61/638,748, filed Apr. 26, 2012, the entire contents of which are hereby incorporated by reference.

FIELD

Embodiments of the invention generally relate to methods for forming metal gates. More specifically, embodiments of the invention are directed to methods of making multi-gate field effect transistor devices.

BACKGROUND

Microelectronic devices are fabricated on a semiconductor substrate as integrated circuits in which various conductive layers are interconnected with one another to permit electronic signals to propagate within the device. An example of such a device is a complementary metal-oxide-semiconductor (CMOS) field effect transistor (FET) or MOSFET.

Over the past decades, the MOSFET has continually been scaled down in size and modern integrated circuits are incorporating MOSFETs with channel lengths of less than 0.1 micron. Devices with a 65 nm feature size (with the channel being even shorter) are currently in production. The decrease in feature size has resulted in certain challenges because small MOSFETs exhibit higher leakage currents, and lower output resistance than larger devices. Still, smaller MOSFETs are desirable for several reasons. The main reason to make transistors smaller is to pack more and more devices in a given chip area, reducing the price per chip. Additionally, the reduction in transistor dimension can help increase the speed.

Because of small MOSFET geometries, the voltage that can be applied to the gate must be reduced to maintain reliability. To maintain performance, the threshold voltage of the MOSFET has to be reduced as well. As threshold voltage is reduced, the transistor cannot be switched from complete turn-off to complete turn-on with the limited voltage swing available. Subthreshold leakage, which was ignored in the past, now can have a significant impact on device performance.

A gate electrode is part of an integrated circuit. For example, a CMOS transistor comprises a gate structure disposed between source and drain regions that are formed in the semiconductor substrate. The gate structure generally comprises a gate electrode and a gate dielectric. The gate electrode is disposed over the gate dielectric to control a flow of charge carriers in a channel region that is formed between drain and source regions beneath the gate dielectric. The gate dielectric typically comprises a thin material layer having a dielectric constant of about 4.0 or greater (for example, gate oxides such as silicon dioxide ($SiO_2$), silicon oxynitride (SiON), and the like).

The gate oxide, which serves as insulator between the gate and channel, should be made as thin as possible to increase the channel conductivity and performance when the transistor is on and to reduce subthreshold leakage when the transistor is off. However, with current gate oxides with a thickness of around 1.2 nm (which in silicon is ~5 atoms thick) the quantum mechanical phenomenon of electron tunneling occurs between the gate and channel, leading to increased power consumption.

It is often traditional transistors, which are often planar, which may experience the aforementioned current leaks. Thus, as transistors become smaller, current leaks through them, which increases as the transistor size decreases. A possible solution to this problem is a three-dimensional gate structure. In these gates, the channel, source and drain are raised out of the substrate and the gate is then draped over the channel on three sides. The goal is to constrain the current to only the raised channel, and abolish any path through which electrons may leak. One such type of transistor is known as FinFET, in which the channel connecting the source and drain is a thin, "fin" jutting out of the substrate. This results in the current being constrained to only the now raised channel, thereby preventing electrons from leaking. These gates are often termed multi-gate. An example of such a multi-gate trasnsitor design is the FinFET, in which the channel connecting the source and drain is a thin "fin" extending from the silicon substrate.

However, while current leaks are prevented, there is a different challenge where a 3-D structure is used, because it is necessary to deposit work function material extremely conformally. Despite the promise that these multi-gates structures show, there are difficulties because the three-dimensional nature of the gates requires that the work function metal be highly conformally deposited. Current methods utilize physical vapor deposition (PVD) techniques for work function metal, which makes it exceedingly difficult to deposit the thin, conformal films that are needed. Thus, there is a need for improved methods for forming metal gates, particularly in the field of mutli-gate structures.

SUMMARY

Provided are methods of making metal gates, suitable for three-dimensional gates (i.e., FinFET). Accordingly, one aspect of the invention relates to a method of manufacturing a metal gate electrode. The method comprises:

forming a high-k dielectric material on a semiconductor substrate;

depositing a high-k dielectric cap layer over the high-k dielectric material;

depositing a PMOS work function layer having a positive work function value;

depositing an NMOS work function layer;

depositing an NMOS work function cap layer over the NMOS work function layer;

removing at least a portion of the PMOS work function layer or at least a portion of the NMOS work function layer; and depositing a fill layer, wherein depositing a high-k dielectric cap layer, depositing a PMOS work function layer or depositing a NMOS work function cap layer comprises atomic layer deposition of TiN, TiSiN, or TiAlN. In alternative embodiments, the PMOS work function layer can be deposited either before or after the NMOS work function layer.

Thus, in one embodiment, the method comprises depositing a PMOS work function layer having a positive work function value over the dielectric cap layer; removing at least a portion of the PMOS work function layer having positive work function value; depositing an NMOS work function layer after removal of at least a portion of the PMOS work function layer; depositing an NMOS work function cap layer over the NMOS work function layer; and depositing a fill layer over the NMOS work function cap layer. In a further embodiment, the NMOS work function cap layer is suitable as a barrier to the fill layer.

In another embodiment, the method comprises: depositing an NMOS work function layer over the dielectric cap layer; depositing an NMOS work function cap layer over the NMOS work function layer; removing at least a portion of the NMOS work function layer; depositing a PMOS work function layer after removal of at least a portion of the NMOS work function layer; and depositing a fill layer over the PMOS work function layer. In a further embodiment, the PMOS work function layer is suitable as a barrier to the fill layer.

There are many variants of the method. For example, in one embodiment, depositing an NMOS work function layer comprises atomic layer deposition of one or more of TaAlC, TaAl, and TiAl. In another embodiment wherein depositing a fill layer comprises chemical vapor deposition of elemental cobalt, elemental aluminum, or elemental tungsten.

In one embodiment, the method further comprises depositing an oxide getter; and removing oxide and at least a portion of the getter. In a further embodiment, depositing the getter comprises RF sputter physical vapor deposition or atomic layer deposition of silicon. In another further embodiment, wherein removing the oxide and getter comprises a dry chemical etch process. In another embodiment, deposition of an oxide getter and removal of oxide and at least a portion of the getter is carried out after deposition of a high-k dielectric cap layer. In yet another embodiment, deposition of an oxide getter and removal of oxide and at least a portion of the getter is carried out after deposition of the NMOS work function layer.

In another variant, the method further comprises depositing an etch stop layer. In one embodiment, depositing an etch stop layer comprises atomic layer deposition of TaN. In another embodiment, the method further comprises tuning the positive work function value to provide a tuned positive work function value.

The above embodiments can be combined in any suitable way. Thus, in one embodiment, the method comprises forming a high-k dielectric material on a semiconductor substrate; depositing a high-k dielectric cap layer over the high-k dielectric material; depositing a first oxide getter over the high-k dielectric cap layer; removing oxide and at least a portion of the first oxide getter; depositing an etch stop layer over the high-k dielectric cap layer; depositing a PMOS work function layer having a positive work function value over the etch stop layer; tuning the positive work function value to provide a tuned positive work function value; removing at least a portion of the PMOS work function layer having positive work function value; depositing an NMOS work function layer after removal of at least a portion of the PMOS work function layer; depositing a second oxide getter; removing oxide and at least a portion of the second oxide getter; depositing a NMOS work function cap layer; and depositing a fill layer wherein depositing a high-k dielectric cap layer, depositing a PMOS work function layer or depositing a NMOS work function cap layer comprises atomic layer deposition of TiN, TiSiN, or TiAlN.

In a specific embodiment, depositing a high-k dielectric cap layer comprises atomic layer deposition of TiN; depositing a first oxide getter comprises RF sputter physical vapor deposition or atomic layer deposition of Si; removing oxide and at least a portion of the first oxide getter comprises a dry chemical etch; depositing an etch stop layer comprises atomic layer deposition of TaN; depositing a PMOS work function layer comprises atomic layer deposition of TiN; tuning the positive work function comprises $O_2$ degassing, adding silicon to the PMOS work function layer to form TiSiN, or adding aluminum to the PMOS work function layer to form TiAlN; removing at least a portion of the PMOS work function layer comprises an etching process; depositing an NMOS work function layer comprises atomic layer deposition of one or more of TaAlC, TiSiN, and TiAlN; depositing a second oxide getter comprises RF sputter physical vapor deposition or atomic layer deposition of Si; removing oxide and at least a portion of the second oxide getter comprises a dry chemical etch; depositing a NMOS work function cap layer comprises atomic layer deposition of TiN; and depositing a fill layer comprises chemical vapor deposition of Co, Al, or W.

In another embodiment, the method comprises forming a high-k dielectric material on a semiconductor substrate; depositing a high-k dielectric cap layer over the high-k dielectric material; depositing a first oxide getter over the high-k dielectric cap layer; removing oxide and at least a portion of the first oxide getter; depositing an etch stop layer over the high-k dielectric cap layer; depositing an NMOS work function layer over the etch stop layer; depositing an NMOS work function cap layer over the NMOS work function layer; removing at least a portion of the NMOS work function layer; depositing a second oxide getter after removal of at least a portion of the NMOS work function layer; removing oxide and at least a portion of the second oxide getter; depositing a PMOS work function layer having positive work function value after removal of at least a portion of the second oxide getter; tuning the positive work function value to provide a tuned positive work function value; and depositing a fill layer, wherein depositing a high-k dielectric cap layer, depositing a PMOS work function layer or depositing a NMOS work function cap layer comprises atomic layer deposition of TiN, TiSiN, or TiAlN. In a specific embodiment, depositing a high-k dielectric cap layer comprises atomic layer deposition of TiN; depositing a first oxide getter comprises RF sputter physical vapor deposition or atomic layer deposition of Si; removing oxide and at least a portion of the first oxide getter comprises a dry chemical etch; depositing an etch stop layer comprises atomic layer deposition of TaN; depositing an NMOS work function layer comprises atomic layer deposition of TaAlC; depositing a NMOS work function cap layer comprises atomic layer deposition of TiN; removing at least a portion of the NMOS work function layer comprises an etching process; depositing a second oxide getter comprises RF sputter physical vapor deposition or atomic layer deposition of Si; removing oxide and at least a portion of the second oxide getter comprises a dry chemical etch; depositing a PMOS work function layer comprises atomic layer deposition of TiN; tuning the positive work function comprises $O_2$ degassing, adding silicon to the PMOS work function layer to form TiSiN, or adding aluminum to the PMOS work function layer to form TiAlN; and depositing a fill layer comprises chemical vapor deposition of Co and Al.

BRIEF DESCRIPTION OF THE DRAWINGS

So that the manner in which the above recited features of the invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
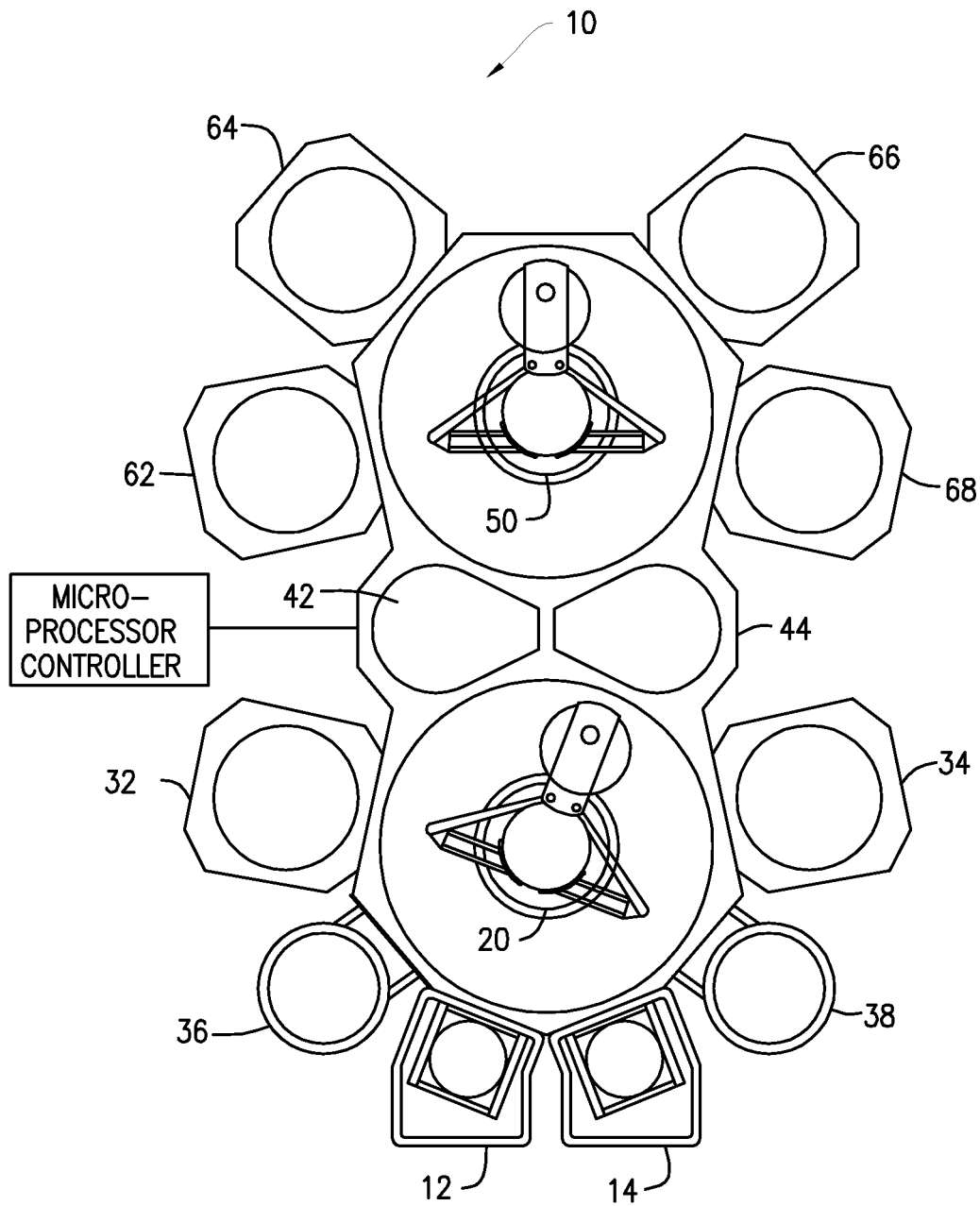
FIG. 1 illustrates a schematic of a cluster tool system in accordance with one or more embodiments of invention.

Before describing several exemplary embodiments of the invention, it is to be understood that the invention is not limited to the details of construction or process steps set forth in the following description. The invention is capable of other embodiments and of being practiced or being carried out in various ways.

Provided are embodiments related to methods of gate formation suitable for three-dimensional, or multi-gate FET devices, particularly for technology node beyond 15 nm. Such methods utilize atomic layer deposition (ALD) and/or chemical vapor deposition (CVD) processes. Embodiments of the methods described herein allow for deposition of very thin metal films, thereby making a metal gate structure with a thin work function metal that is easy to oxidize.

Accordingly, one aspect of the invention pertains to methods of manufacturing metal gates for multi-gate structures. The method generally comprises forming a high-k dielectric material on a semiconductor substrate; depositing a high-k dielectric cap layer over the high-k dielectric material; depositing a PMOS work function layer having a positive work function value; depositing an NMOS work function layer; depositing an NMOS work function cap layer over the NMOS work function layer; removing at least a portion of the PMOS work function layer or at least a portion of the NMOS work function layer; and depositing a fill layer.

In two alternative embodiments, either the PMOS or NMOS can be deposited first. Accordingly, one embodiment of the methods described herein comprises depositing a high-k dielectric cap layer, depositing a PMOS work function layer or depositing a NMOS work function cap layer comprises atomic layer deposition of TiN, TiSiN, or TiAlN. In another embodiment, the method comprises depositing an NMOS work function layer over the dielectric cap layer; depositing an NMOS work function cap layer over the NMOS work function layer; removing at least a portion of the NMOS work function layer; depositing a PMOS work function layer after removal of at least a portion of the NMOS work function layer; and depositing a fill layer over the PMOS work function layer.

In one or more embodiments, certain components of the metal gate can serve more than one function. For example, in embodiments where the PMOS work function layer is deposited before the NMOS work function layer, the NMOS work function cap layer is suitable as a barrier to the fill layer. In other embodiments where the NMOS work function layer is deposited before the PMOS work function layer, the PMOS work function layer is suitable as a barrier to the fill layer.

The high-k dielectric film can be any suitable film. In detailed embodiments, the high-k dielectric film comprises an element selected from the group consisting of Hf, Zr, Ta, La, Gd, Y, Al, Pr, Sc, Ti, In, Lu, rare-earth metals and combinations thereof. In specific embodiments, the high-k film metal oxides and/or metal silicates of one or more of Hf, Zr, Ta, La, Gd, Y, Al, Pr, Sc, Ti, In, Lu, rare-earth metals and combinations thereof. In detailed embodiments, the high-k dielectric film comprises hafnium oxide.

The high-k dielectric film can be deposited by any suitable technique, including, but not limited to, chemical vapor deposition (CVD) and atomic layer deposition (ALD). In detailed embodiments, the high-k film is deposited by atomic layer deposition. In a specific embodiment, the substrate surface with dangling bonds is sequentially exposed to a precursor gas comprising one or more of the materials listed above followed by exposure to a precursor gas comprising an oxidant.

The components of the method can be carried out using various materials and/or processes. For example, in one or more embodiments, depositing a high-k dielectric cap layer, depositing a PMOS work function layer or depositing a NMOS work function cap layer comprises atomic layer deposition of TiN, TiSiN, or TiAlN. Generally, any ALD method of depositing TiN that achieves conformal layers is suitable for depositing TiN according to various embodiments of the invention. However, one non-limiting example of such an ALD process comprises using titanium tetrachloride and ammonia precursors. The film can then be doped with silicon and/or aluminum.

As discussed above, TiN films can be useful as a high-k dielectric cap layer, a P-Metal work function layer, as a layer to prevent oxidation of the N-metal work function film, and/or as a barrier layer to an aluminum fill. The thickness of the film an vary according to the function. Thus, in embodiments where TiN is used as a cap layer, the TiN film has a thickness of about 5 to about 20 Angstroms or about 10 to about 15 Angstroms. In embodiments where the TiN films acts as a P-Metal workfunction layer, the thickness can be about 20 to about 60 Angstroms, and in specific embodiments, about 40 Angstroms. Also, the work function of TiN films can be changed by varying the thickness of the film, or by doping the film with oxygen or silicon. In other embodiments where the TiN film is a barrier layer to aluminum fill or is used to prevent oxidation of the N-Metal work function film, the TiN film can have a thickness of about 10 to about 25, and in specific embodiments, about 15 to about 20 Angstroms.

In other embodiments, films comprising TaAlC can be used. Generally, any ALD method of depositing TaAlC that achieves conformal layers is suitable for depositing TaAlC according to various embodiments of the invention. However, one non-limiting example of such an ALD process comprises using tantalum pentachloride and triethyl aluminum precursors.

In yet other embodiments, films of TaAl or TiAl can be used. These films can be despited using TaCl5 or TiCl5 and an alane precursor (i.e., dimethylethyl alane).

Films comprising TaAlC, TaAl or TiAl can be utilized according to aspects of the invention as an N-Metal work function layer, or as a wetting layer for aluminum fill. In embodiments where the TaAlC film is used as an N-metal work function layer, the film can have a thickness ranging from about 10 to about 50 Angstroms, or in specific embodiments, from about 20 to about 40 Angstroms. Also, the work function can be varied by changing the amount of aluminum of the film. In other embodiments where the TaAlC/TaAl or TiAl films are used as a wetting layer for aluminum fill, the film can have a thickness of about 5 to about 15 Angstroms. In further embodiments, the TaAlC film has a thickness of about 10 Angstroms.

Certain embodiments relate to the fill layer. The fill layers may be deposited via chemical vapor deposition, and can comprise elemental cobalt, elemental aluminum or elemental tungsten. In embodiments, where a cobalt film is deposited, the film can be used as a wetting layer for aluminum fill and/or as a P-metal work function layer. Elemental Al can be also be used as an N-metal.

Generally, any CVD method of depositing Co that achieves conformal layers is suitable for depositing Co according to various embodiments of the invention. However, one non-limiting example of such a CVD process comprises using dicobalt hexacarbonyl tertiary-butyl acetylene and hydrogen precursors. In embodiments where the Co film is used as a wetting layer for an aluminum fill, the Co film can have a thickness of about 3 to about 20 Angstroms, and in specific embodiments, about 5 to about 15 Angstroms. In other embodiments, where cobalt films are used as a P-metal work function metal layer, the film can have a thickness of about 30 to about 50 Angstroms. The work function value can be varied by adjusting the thickness of the film. For example a cobalt film having a thickness greater than about 50A will have a work function greater than about 5.0 eV. Many applications generally require about 4.8 eV or greater, thus a thinner Co film can be used. Additionally, the resistivity of cobalt is low. Therefore, in alternative embodiments, the cobalt film can be as the complete film, instead of aluminum. In such embodiments, the thickness of the Co film will be greater than about 300 Angstroms.

In yet other embodiments of the invention, a film comprising aluminum is used. Such aluminum films can be used for the gap fill. Generally, any method of aluminum deposition suitable for semiconductors can be used. On non-limiting example of such a method is CVD of aluminum using a dimethyl aluminum hydride precursor or alane precursor (i.e, dimethylethyl amine alane or methylpyrrolidine-alane). The thickness of this film will generally be greater than about 300 Angstroms.

Other embodiments of the invention relate to methods using an oxide getter. In such embodiments, the method comprises depositing an oxide getter; and removing oxide and at least a portion of the getter. Examples of such getters include films comprising silicon. Again, any suitable process for silicon deposition that is suitable for semiconductor devices may be used. In one embodiment, the deposition of silicon is accomplished by ALD of silicon precursors comprising silicon, tetrabromide, pyridine and/or disilane. In some embodiments, depositing the getter comprises RF sputter physical vapor deposition or atomic layer deposition of silicon. The silicon films can be used for oxygen gettering. In various embodiments, the film has a thickness of about 5 to 60 Angstroms.

In one or more embodiments, deposition of an oxide getter and removal of oxide and at least a portion of the getter is carried out after deposition of a high-k dielectric cap layer. In one or more other embodiments, deposition of an oxide getter and removal of oxide and at least a portion of the getter is carried out after deposition of the NMOS work function layer. In other embodiments, still, the method further comprises depositing an etch stop layer. This etch stop layer may comprise atomic layer deposited TaN.

Various embodiments of the invention relate to a dry chemical etch/treatment process. This process can be used to remove the oxide and getter deposited. One such dry clean process, which may be referred to as a SICONI™ process, can potentially improve the electrical characteristics of the device versus conventional wet cleaning techniques, as well as provide a path to more scalable devices to allow further miniaturization of microelectronic components.

A SICONI™ etch is a remote plasma assisted dry etch process which involves the simultaneous exposure of a substrate to $H_2$, $NF_3$ and $NH_3$ plasma by-products. Ammonia and nitrogen trifluoride are combined to form a cleaning mixture. The amount of each gas can be adjusted to accommodate, for example, the thickness of the oxide layer to be removed, the geometry of the substrate being cleaned, the volume capacity of the chamber where a plasma is formed and the volume capacity of the processing chamber. For example, the ammonia and nitrogen trifluoride may be present in a molar ratio in the range of about 1:1 to about 30:1. In various embodiments, the molar ratio of the ammonia to nitrogen trifluoride is in the range of about 2:1 to about 20:1, or in the range of about 3:1 to about 15:1, or in the range of about 5:1 to about 10:1, or in the range of about 10:1 to about 20:1. Remote plasma excitation of the hydrogen and fluorine species allows plasma-damage-free substrate processing.

A purge gas (also referred to as a carrier gas or diluent gas) may be added to the gas mixture. Any suitable purge gas may be used, such as, but not limited to, argon, helium, hydrogen, nitrogen and mixtures thereof. Typically, the overall gas mixture is in the range of about 0.05% to about 20% by volume of ammonia and nitrogen trifluoride. The remainder being the purge gas. The gas mixture (ammonia, nitrogen trifluoride and purge gas) are maintained at a suitable operating pressure. Typically, the pressure is maintained in a range of about 500 mTorr and 30 Torr. In various embodiments, the pressure is maintained in a range of about 1 Torr to about 10 Torr, or in the range of about 2 Torr and about 8 Torr, or in the range of about 3 Torr to about 6 Torr.

Some embodiments of the invention relate to tuning the work function value of metal films. Thus, in some embodiments, the methods comprise tuning the work function value to provide a tuned positive work function value. Tuning a positive work function value can be accomplished in any method known in the art. For example, the film may be degassed using oxygen. In embodiments using TiN, tuning the work function metal may comprise doping with silicon or aluminum to form TiSiN and TiAlN, respectively. In other embodiments, the methods comprise tuning the work function value to provide a tuned negative work function value. For example, NMOS work function films TaAlC, TaAl and/or TiAl may be tuned by doping with N.

In another aspect of the invention, the method comprises forming a high-k dielectric material on a semiconductor substrate; depositing a high-k dielectric cap layer over the high-k dielectric material; depositing a first oxide getter over the high-k dielectric cap layer; removing oxide and at least a portion of the first oxide getter; depositing an etch stop layer over the high-k dielectric cap layer; depositing a PMOS work function layer having a positive work function value over the etch stop layer; tuning the positive work function value to provide a tuned positive work function value; removing at least a portion of the PMOS work function layer having positive work function value; depositing an NMOS work function layer after removal of at least a portion of the PMOS work function layer; depositing a second oxide getter; removing oxide and at least a portion of the second oxide getter; depositing a NMOS work function cap layer; and depositing a fill layer, wherein depositing a high-k dielectric cap layer, depositing a PMOS work function layer or depositing a NMOS work function cap layer comprises atomic layer deposition of TiN, TiSiN, or TiAlN.

In a more specific variant of this embodiment, depositing a high-k dielectric cap layer comprises atomic layer deposition of TiN; depositing a first oxide getter comprises RF sputter physical vapor deposition or atomic layer deposition of Si; removing oxide and at least a portion of the first oxide getter comprises a dry chemical etch; depositing an etch stop layer comprises atomic layer deposition of TaN; depositing a PMOS work function layer comprises atomic layer deposition of TiN; tuning the positive work function comprises $O_2$ degassing, adding silicon to the PMOS work function layer to form TiSiN, or adding aluminum to the PMOS work function layer to form TiAlN; removing at least a portion of the PMOS work function layer comprises an etching process; depositing an NMOS work function layer comprises atomic layer deposition of one or more of TaAlC, TiSiN, and TiAlN; depositing a second oxide getter comprises RF sputter physical vapor deposition or atomic layer deposition of Si; removing oxide and at least a portion of the second oxide getter comprises a dry chemical etch; depositing a NMOS work function cap layer comprises atomic layer deposition of TiN; and depositing a fill layer comprises chemical vapor deposition of Co, Al, or W.

Another aspect of the invention relates to a method of making a metal gate, the method comprising forming a high-k dielectric material on a semiconductor substrate; depositing a high-k dielectric cap layer over the high-k dielectric material; depositing a first oxide getter over the high-k dielectric cap layer; removing oxide and at least a portion of the first oxide getter; depositing an etch stop layer over the high-k dielectric cap layer; depositing an NMOS work function layer over the etch stop layer; depositing an NMOS work function cap layer over the NMOS work function layer; removing at least a portion of the NMOS work function layer; depositing a second oxide getter after removal of at least a portion of the NMOS work function layer; removing oxide and at least a portion of the second oxide getter; depositing a PMOS work function layer having positive work function value after removal of at least a portion of the second oxide getter; tuning the positive work function value to provide a tuned positive work function value; and depositing a fill layer, wherein depositing a high-k dielectric cap layer, depositing a PMOS work function layer or depositing a NMOS work function cap layer comprises atomic layer deposition of TiN, TiSiN a high-k dielectric cap layer comprises atomic layer deposition of TiN; depositing a first oxide getter comprises RF sputter physical vapor deposition or atomic layer deposition of Si; removing oxide and at least a portion of the first oxide getter comprises a dry chemical etch; depositing an etch stop layer comprises atomic layer deposition of TaN; depositing an NMOS work function layer comprises atomic layer deposition of TaAlC; depositing a NMOS work function cap layer comprises atomic layer deposition of TiN; removing at least a portion of the NMOS work function layer comprises an etching process; depositing a second oxide getter comprises RF sputter physical vapor deposition or atomic layer deposition of Si; removing oxide and at least a portion of the second oxide getter comprises a dry chemical etch; depositing a PMOS work function layer comprises atomic layer deposition of TiN; tuning the positive work function comprises $O_2$ degassing, adding silicon to the PMOS work function layer to form TiSiN, or adding aluminum to the PMOS work function layer to form TiAlN; and depositing a fill layer comprises chemical vapor deposition of Co and Al.

Embodiments of the invention described herein involve the formation of metal gates on substrates. Examples of substrates include, but are not limited to, semiconductor wafers, such as crystalline silicon (e.g., Si<100> or Si<111>), silicon oxide, silicon germanium, doped or undoped polysilicon, doped or undoped silicon wafers, silicon nitride, gallium wafers, indium wafers, aluminum wafers, tin wafers and patterned or non-patterned wafers. The terms "wafer" and "substrate" are used interchangeably.

As used in this specification and the appended claims, the term "substrate surface" refers to either a bare substrate surface or a substrate surface having a layer thereon. For example, if a first processing step deposits a layer A and precursor B is said to react with the substrate surface, then the substrate surface that precursor B reacts with is either the bare substrate or the layer A.

As is evident from the above, many precursors are within the scope of the invention. Precursors may be a plasma, gas, liquid or solid at ambient temperature and pressure. However, within the ALD chamber, precursors are usually volatilized. As used in this specification and the appended claims, the term "ambient conditions" means the conditions (e.g., temperature, pressure, gaseous environment) outside the processing chamber or cluster tool.

The processes of the invention can be carried out in equipment known in the art of ALD, CVD, etc. The apparatus brings the sources into contact with a substrate on which the films are grown. Hardware that can be used to deposit films include ALD apparatus as disclosed in U.S. patent application Ser. No. 10/251,715, filed Sep. 20, 2002, assigned to Applied Material, Inc., Santa Clara, Calif. and entitled "An Apparatus for the Deposition of High K dielectric Constant Films," published as United States Application Publication No. 2003/0101938. In atomic layer deposition-type chambers, the substrate can be exposed to the first and second precursors either spatially or temporally separated processes. Temporal ALD is a traditional process in which the first precursor flows into the chamber to react with the surface. The first precursor is purged from the chamber before flowing the second precursor. In spatial ALD, both the first and second precursors are simultaneously flowed to the chamber but are separated spatially so that there is a region between the flows that prevents mixing of the precursors. In spatial ALD, the substrate must be moved relative to the gas distribution plate, or vice-versa.

The substrate can be processed in single substrate deposition chambers, where a single substrate is loaded, processed and unloaded before another substrate is processed. The substrate can also be processed in a continuous manner, like a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and exposed to the deposition gases at different positions.

The control system may further a computer-readable medium having a set of machine-executable instructions. These instructions may be such that, when executed by the CPU, cause the apparatus to perform any of the methods previously described. In one embodiment, the instructions relate to a method comprising any of the methods described herein.

The apparatus may further comprise other chambers. These chambers can include transfer chambers and additional processing chambers, such as deposition chambers and cleaning chambers. These chambers may be interconnected in a "cluster tool system."

Generally, a cluster tool is a modular system comprising multiple chambers which perform various functions including substrate center-finding and orientation, degassing, annealing, deposition and/or etching. The multiple chambers of the cluster tool are mounted to a central transfer chamber which houses a robot adapted to shuttle substrates between the chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. The details of one such staged-vacuum substrate processing system is disclosed in U.S. Pat. No. 5,186,718, entitled "Staged-Vacuum Wafer Processing System and Method," Tepman et al., issued on Feb. 16, 1993, which is incorporated herein by reference. However, the exact arrangement and combination of chambers may be altered for purposes of performing specific steps of a fabrication process, which includes the present cleaning process.

FIG. 1 shows an example of a cluster tool or multi-chamber processing system 10 according to one aspect of the invention. The processing system 10 can include one or more load lock chambers 12, 14 for transferring substrates into and out of the system 10. Typically, since the system 10 is under vacuum, the load lock chambers 12, 14 may "pump down" substrates introduced into the system 10. A first robot 20 may transfer the substrates between the load lock chambers 12, 14, and a first set of one or more substrate processing chambers 32, 34, 36, 38. The first robot 20 can also transfer substrates to/from one or more transfer chambers 42, 44. The transfer chambers 42, 44 can be used to maintain ultrahigh vacuum conditions while allowing substrates to be transferred within the system 10. A second robot 50 can transfer the substrates between the transfer chambers 42, 44 and a second set of one or more processing chambers 62, 64, 66, 68.

Each processing chamber 32, 34, 36, 38, may be configured to perform a number of substrate processing operations. For example, the chambers may be configured for a dry etching process, atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. In one embodiment, chamber 32 is configured for the atomic layer deposition, chamber 62 is a chamber for atomic layer deposition or physical vapor deposition of silicon, chamber 64 is a chamber for the atomic layer deposition of TaN, chamber 66 is a chamber for chemical vapor deposition of aluminum, chamber 68 is configured for SICONI™, chamber 34 is configured for atomic layer deposition of TiN, and chamber 38 is configured for $O_2$ degassing. Additional or fewer chambers can be used as needed for a given process.

Similar to processing chambers 32, 34, 36, 38, the processing chambers 62, 64, 66, 68 can be configured to perform a variety of substrate processing operations, including the fluorinating and dry etch processes described in the following, in addition to cyclical layer deposition (CLD), atomic layer deposition (ALD), chemical vapor deposition (CVD), physical vapor deposition (PVD), epitaxial deposition, etch, pre-clean, chemical clean, thermal treatment such as RTP/RadOx®, plasma nitridation, hydroxylation, degas, and orientation. Any of the substrate processing chambers 32, 34, 36, 38, 62, 64, 66, 68 may be removed from the system 10 if not needed.

By carrying out this process in a chamber on a cluster tool, surface contamination of the substrate with atmospheric impurities is avoided. In some embodiments, a process is performed including a first step in which the robot 20 moves a substrate from one of the load lock chambers 12, 14 to a dry etch or cleaning chamber, for example, a SICONI™ chamber.

Figure 2:
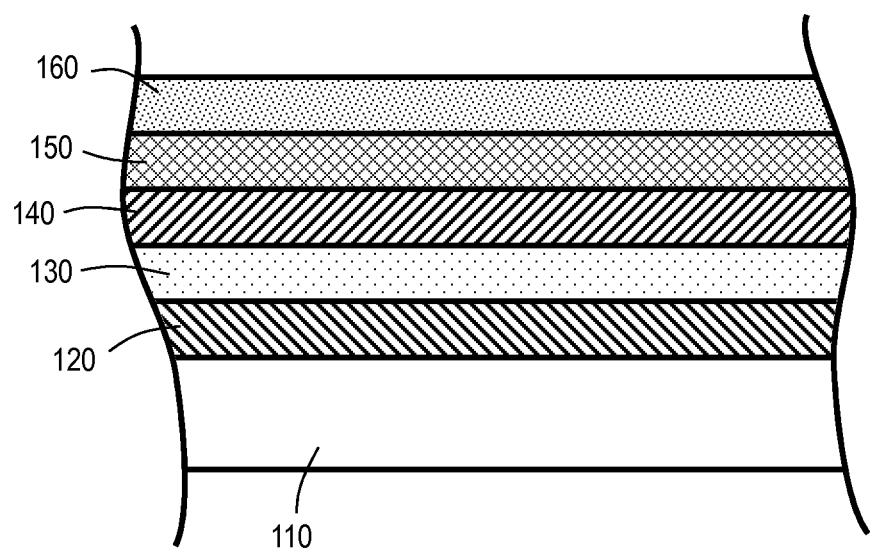
FIG. 2 is a diagram of an embodiment of a high-k dielectric material, a high-k dielectric cap layer, a PMOS work function layer, an NMOS work function layer, and an NMOS work function cap layer.

FIG. 2 is a diagram of an embodiment of a high-k dielectric material, a high-k dielectric cap layer, a PMOS work function layer, an NMOS work function layer, and an NMOS work function cap layer.

A high-k dielectric material 120 is formed on a semiconductor substrate 110. A high-k dielectric cap layer 130 is deposited over the high-k dielectric material 120, wherein the high-k dielectric cap layer comprises TiN or TiSiN. A PMOS work function layer 140 having a positive work function value is deposited, wherein the PMOS work function layer comprises TiN or TiSiN. An NMOS work function layer 150 comprising one or more of TiAl, TaAl, TaAlC, and TiAlN is deposited. An NMOS work function cap layer 160 is deposited over the NMOS work function layer 150, wherein the NMOS work function cap layer 160 comprises TiN, or TiSiN. At least a portion of the PMOS work function layer 140, or at least a portion of the NMOS work function layer 150 is removed.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A method of manufacturing a metal gate electrode, the method comprising:
   forming a high-k dielectric material on a semiconductor substrate;
   depositing a high-k dielectric cap layer over the high-k dielectric material, wherein the high-k dielectric cap layer is a barrier to aluminum;
   depositing a PMOS work function layer having a positive work function value, wherein the PMOS work function layer is a barrier to the fill layer;
   depositing an NMOS work function layer;
   depositing an NMOS work function cap layer over the NMOS work function layer, wherein the NMOS cap layer is a barrier to the fill layer;
   removing at least a portion of the PMOS work function layer or at least a portion of the NMOS work function layer; and
   depositing a fill layer.

2. The method of claim 1, wherein the method comprises:
   depositing a PMOS work function layer having a positive work function value over the dielectric cap layer;
   removing at least a portion of the PMOS work function layer having positive work function value;
   depositing an NMOS work function layer after removal of at least a portion of the PMOS work function layer;
   depositing an NMOS work function cap layer over the NMOS work function layer; and
   depositing a fill layer over the NMOS work function cap layer.

3. The method of claim 2, wherein the NMOS work function cap layer is TiN or TiSiN.

4. The method of claim 3, wherein depositing an NMOS work function layer comprises atomic layer deposition of one or more of TaAlC, TaAl, TiAlN, and TiAl.

5. The method of claim 1, wherein the method comprises:
depositing an NMOS work function layer over the dielectric cap layer;
depositing an NMOS work function cap layer over the NMOS work function layer;
removing at least a portion of the NMOS work function layer;
depositing a PMOS work function layer after removal of at least a portion of the NMOS work function layer; and
depositing a fill layer over the PMOS work function layer.

6. The method of claim 1, wherein the PMOS work function layer is TiN or TiSiN.

7. The method of claim 1, wherein the metal gate electrode is suitable for use in a FinFET structure.

8. The method of claim 1, wherein depositing a fill layer comprises chemical vapor deposition of elemental cobalt, elemental aluminum, or elemental tungsten.

9. The method of claim 1, further comprising:
depositing an oxide getter on the high-k cap layer; and
removing and at least a portion of the oxide getter.

10. The method of claim 9, wherein depositing the getter comprises RF sputter physical vapor deposition or atomic layer deposition of silicon.

11. The method of claim 9, wherein removing the oxide getter comprises a dry chemical etch process.

12. The method of claim 9, wherein deposition of an oxide getter and removal of at least a portion of the oxide getter is carried out after deposition of a high-k dielectric cap layer.

13. The method of claim 9, wherein deposition of the oxide getter and removal of at least a portion of the oxide getter is carried out after deposition of the NMOS work function layer.

14. The method of claim 1, further comprising depositing an etch stop layer.

15. The method of claim 14, wherein depositing an etch stop layer comprises atomic layer deposition of TaN.

16. The method of claim 1, further comprising tuning the positive work function value to provide a tuned positive work function value.

17. A method of making a metal gate, the method comprising:
forming a high-k dielectric material on a semiconductor substrate;
depositing a high-k dielectric cap layer comprising TiN or TiSiN over the high-k dielectric material;
depositing a first oxide getter over the high-k dielectric cap layer;
removing oxide and at least a portion of the first oxide getter;
depositing an etch stop layer over the high-k dielectric cap layer;
depositing a PMOS work function layer having a positive work function value over the etch stop layer;
tuning the positive work function value to provide a tuned positive work function value;
removing at least a portion of the PMOS work function layer having positive work function value;
depositing an NMOS work function layer after removal of at least a portion of the PMOS work function layer;
depositing a second oxide getter;
removing oxide and at least a portion of the second oxide getter;
depositing a NMOS work function cap layer, wherein the NMOS work function cap layer comprises TiN or TiSiN; and
depositing a fill layer.

18. The method of claim 17, wherein:
depositing a high-k dielectric cap layer comprises atomic layer deposition of TiN;
depositing a first oxide getter comprises RF sputter physical vapor deposition or atomic layer deposition of Si;
removing oxide and at least a portion of the first oxide getter comprises a dry chemical etch;
depositing an etch stop layer comprises atomic layer deposition of TaN;
depositing a PMOS work function layer comprises atomic layer deposition of TiN;
tuning the positive work function comprises $O_2$ degassing, or adding silicon to the PMOS work function layer to form TiSiN;
removing at least a portion of the PMOS work function layer comprises an etching process;
depositing an NMOS work function layer comprises atomic layer deposition of one or more of TaAlC, TiSiN, and TiAlN;
depositing a second oxide getter comprises RF sputter physical vapor deposition or atomic layer deposition of Si;
removing oxide and at least a portion of the second oxide getter comprises a dry chemical etch;
depositing a NMOS work function cap layer comprises atomic layer deposition of TiN; and
depositing a fill layer comprises chemical vapor deposition of Co, Al, or W.

19. A method of making a metal gate, the method comprising:
forming a high-k dielectric material on a semiconductor substrate;
depositing a high-k dielectric cap layer over the high-k dielectric material;
depositing a first oxide getter over the high-k dielectric cap layer;
removing oxide and at least a portion of the first oxide getter;
depositing an etch stop layer over the high-k dielectric cap layer;
depositing an NMOS work function layer over the etch stop layer;
depositing an NMOS work function cap layer over the NMOS work function layer;
removing at least a portion of the NMOS work function layer;
depositing a second oxide getter after removal of at least a portion of the NMOS work function layer;
removing oxide and at least a portion of the second oxide getter;
depositing a PMOS work function layer having positive work function value after removal of at least a portion of the second oxide getter;
tuning the positive work function value to provide a tuned positive work function value; and
depositing a fill layer wherein depositing a high-k dielectric cap layer, depositing a PMOS work function layer or depositing a NMOS work function cap layer comprises atomic layer deposition of TiN, TiSiN, or TiAlN.

20. The method of claim 19, wherein
depositing a high-k dielectric cap layer comprises atomic layer deposition of TiN;
depositing a first oxide getter comprises RF sputter physical vapor deposition or atomic layer deposition of Si;
removing oxide and at least a portion of the first oxide getter comprises a dry chemical etch;

depositing an etch stop layer comprises atomic layer deposition of TaN;
depositing an NMOS work function layer comprises atomic layer deposition of TaAlC;
depositing a NMOS work function cap layer comprises atomic layer deposition of TiN;
removing at least a portion of the NMOS work function layer comprises an etching process;
depositing a second oxide getter comprises RF sputter physical vapor deposition or atomic layer deposition of Si;
removing oxide and at least a portion of the second oxide getter comprises a dry chemical etch;
depositing a PMOS work function layer comprises atomic layer deposition of TiN;
tuning the positive work function comprises $O_2$ degassing, adding silicon to the PMOS work function layer to form TiSiN, or adding aluminum to the PMOS work function layer to form TiAlN; and
depositing a fill layer comprises chemical vapor deposition of Co and Al.

* * * * *